(12) United States Patent
Verma et al.

(10) Patent No.: US 10,529,854 B1
(45) Date of Patent: Jan. 7, 2020

(54) SEMICONDUCTOR DEVICE AND METHOD FOR FABRICATING THE SAME

(71) Applicant: UNITED MICROELECTRONICS CORP., Hsin-Chu (TW)

(72) Inventors: Purakh Raj Verma, Singapore (SG); Chih-Wei Su, Taichung (TW); Je-Min Wen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/109,714

(22) Filed: Aug. 22, 2018

(30) Foreign Application Priority Data

Jul. 17, 2018 (CN) .......................... 2018 1 0784990

(51) Int. Cl.
| | | |
|---|---|---|
| *H01L 29/78* | (2006.01) | |
| *H01L 29/786* | (2006.01) | |
| *H01L 21/764* | (2006.01) | |
| *H01L 29/66* | (2006.01) | |
| *H01L 21/311* | (2006.01) | |
| *H01L 29/06* | (2006.01) | |
| *H01L 21/762* | (2006.01) | |

(52) U.S. Cl.
CPC .... *H01L 29/7841* (2013.01); *H01L 21/31111* (2013.01); *H01L 21/764* (2013.01); *H01L 21/76264* (2013.01); *H01L 29/0649* (2013.01); *H01L 29/66742* (2013.01); *H01L 29/78603* (2013.01)

(58) Field of Classification Search
CPC .......... H01L 29/7841; H01L 21/31111; H01L 21/764; H01L 29/0649; H01L 29/66742; H01L 29/78603; H01L 21/76264
See application file for complete search history.

(56) References Cited

U.S. PATENT DOCUMENTS

| | | | |
|---|---|---|---|
| 8,507,989 B2 | 8/2013 | Khakifirooz et al. | |
| 9,349,793 B2 | 5/2016 | Jaffe et al. | |
| 10,156,676 B1* | 12/2018 | Shank | ...................... G02B 6/122 |
| 2012/0038024 A1* | 2/2012 | Botula | .............. H01L 21/76289 257/510 |
| 2015/0348825 A1* | 12/2015 | Hebert | .................. H01L 21/764 257/522 |
| 2016/0071925 A1* | 3/2016 | Jaffe | .................... H01L 29/0649 257/347 |
| 2018/0337043 A1* | 11/2018 | Englekirk | ......... H01L 21/02658 |

* cited by examiner

*Primary Examiner* — Feifei Yeung Lopez
(74) *Attorney, Agent, or Firm* — Winston Hsu

(57) ABSTRACT

A method for fabricating semiconductor device includes the steps of: providing a substrate having a first silicon layer, an insulating layer on the first silicon layer, and a second silicon layer on the insulating layer; forming a metal-oxide semiconductor (MOS) transistor on the substrate; forming an interlayer dielectric layer (ILD) on the MOS transistor; removing part of the ILD layer to form a first trench to expose the insulating layer; and performing a wet etching process through the first trench to remove part of the insulating layer for forming a first air gap under the MOS transistor.

20 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method of forming air gap under active device for reducing capacitance of the device.

2. Description of the Prior Art

In radio frequency (RF) integrated circuit application, such as RF switch device or power amplifier device, performance is suffered from "parasitic surface charge" issue, which in turn generates harmonic effect. There are several wafer process technologies available for solving the issue such as using semiconductor-on-insulator (SOI) wafer to isolate the charges from the high resistivity wafer substrate. However, the utilization of SOI wafer or substrate in current process usually results in higher cost. Hence how to improve the performance of current process while finding a more effective way to lower cost has become an important task in this field.

SUMMARY OF THE INVENTION

According to an embodiment of the present invention, a method for fabricating semiconductor device includes the steps of: providing a substrate having a first silicon layer, an insulating layer on the first silicon layer, and a second silicon layer on the insulating layer; forming a metal-oxide semiconductor (MOS) transistor on the substrate; forming an interlayer dielectric layer (ILD) on the MOS transistor; removing part of the ILD layer to form a first trench to expose the insulating layer; and performing a wet etching process through the first trench to remove part of the insulating layer for forming a first air gap under the MOS transistor.

According to another aspect of the present invention, a semiconductor device includes: a substrate having a first silicon layer, an insulating layer on the first silicon layer, and a second silicon layer on the insulating layer; a metal-oxide semiconductor (MOS) transistor on the substrate; and a first air gap in the insulating layer and directly under the MOS transistor.

According to yet another aspect of the present invention, a semiconductor device includes: a substrate having a first silicon layer, an insulating layer on the first silicon layer, and a second silicon layer on the insulating layer; a metal-oxide semiconductor (MOS) transistor on the substrate; an interlayer dielectric (ILD) layer on the MOS transistor; and a first air gap under the MOS transistor and extended upward into the ILD layer, wherein the first air gap comprises a U-shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
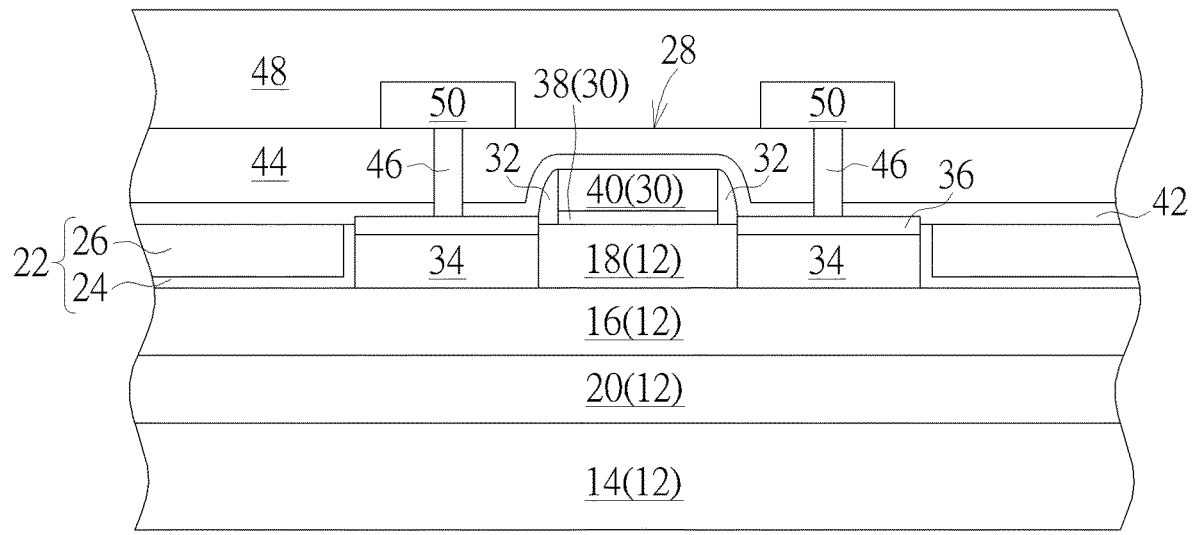
FIGS. 1-7 illustrate a method for fabricating a semiconductor device according to an embodiment of the present invention.

Referring to FIGS. 1-7, FIGS. 1-7 illustrate a method for fabricating a semiconductor device according to an embodiment of the present invention. As shown in FIG. 1, a substrate 12, such as a silicon-on-insulator (SOI) substrate is provided, in which the substrate 12 preferably includes a first semiconductor layer 14, an insulating layer 16 on the first semiconductor layer 14, and a second semiconductor layer 18 on the insulating layer 16. Preferably, the first semiconductor layer 14 and the second semiconductor layer 18 could be made of same material or different material and could both be made of material including but not limited to for example silicon, germanium, or silicon germanium (SiGe). The insulating layer 16 disposed between the first semiconductor layer 14 and the second semiconductor layer 18 preferably includes $SiO_2$, but not limited thereto. Preferably, an additional trap rich layer 20 is disposed between the first semiconductor layer 14 and the insulating layer 16 depending on the demand of the process, in which the trap rich layer 20 preferably includes a polysilicon layer or a dielectric layer having high resistance (such as having a resistance greater than 4000 Ohms). In this embodiment, the polysilicon layer could be a polysilicon layer doped with hydrogen and the dielectric layer could be made of silicon oxide or silicon nitride.

Next, as part of the second semiconductor layer 18 could be removed to form a shallow trench isolation (STI) 22 around the second semiconductor layer 18, in which an active device is preferably formed on the second semiconductor layer 18 surrounded by the STI 22. In this embodiment, the STI 22 preferably includes a liner 24 made of silicon nitride (SiN) and an insulating layer 26 made of silicon oxide, in which the liner 24 is disposed on the top surface of the insulating layer 16 and surrounding the active device formed afterwards and the insulating layer 26 is disposed on the liner 24.

Next, an active device is formed on the substrate 12. In this embodiment, the active device is preferably a MOS transistor 28, which preferably includes a gate structure 30, a spacer 32 on sidewalls of the gate structure 30, a source/drain region 34 in the second semiconductor layer 18 adjacent to two sides of the spacer 32, and a selective silicide 36 on the surface of the source/drain region 34.

In this embodiment, the gate structure 30 further includes a gate dielectric layer 38 and a gate material layer or gate electrode 40 on the gate dielectric layer 38, in which the gate dielectric layer 38 could include $SiO_2$, silicon nitride, or high-k dielectric layer and the gate electrode 40 could include metal, polysilicon, or silicides.

The spacer 32 could be a single spacer made of material including but not limited to for example $SiO_2$, SiN, SiON, SiCN, or combination thereof. Nevertheless, according to an embodiment of the present invention, the spacer 32 could also be a composite spacer including a first sub-spacer (not shown) and a second sub-spacer (not shown), in which one of the first sub-spacer and the second sub-spacer could be L-shaped or I-shaped, the first sub-spacer and the second sub-spacer could be made of same material or different material, and both the first sub-spacer and the second sub-spacer could be made of material including but not limited to for example $SiO_2$, SiN, SiON, SiCN, or combination thereof, which are all within the scope of the present invention.

Next, a selective contact etch stop layer (CESL) 42 preferably made of silicon nitride could be formed on the substrate 12 to cover the gate structure 30 and an ILD layer 44 is formed on the CESL 42. Next, a pattern transfer process could be conducted by using a patterned mask to remove part of the ILD layer 44 and part of the CESL 42 adjacent to the gate structure 30 to form contact holes (not shown) exposing the source/drain region 34 underneath. Next, metals including a barrier layer selected from the group consisting of Ti, Ta, TiN, TaN, and WN and a metal layer selected from the group consisting of W, Cu, Al, TiAl, and cobalt tungsten phosphide (CoWP) could be deposited into each of the contact holes. Next, a planarizing process such as chemical mechanical polishing (CMP) process is conducted to remove part of the metal materials to form contact holes 46 in the contact holes for electrically connecting the source/drain region 48. Next, metal-interconnect process could be conducted to form an inter-metal dielectric (IMD) layer 48 on the ILD layer 44 and metal interconnections 50 electrically connecting the contact plugs 46.

Figure 2:
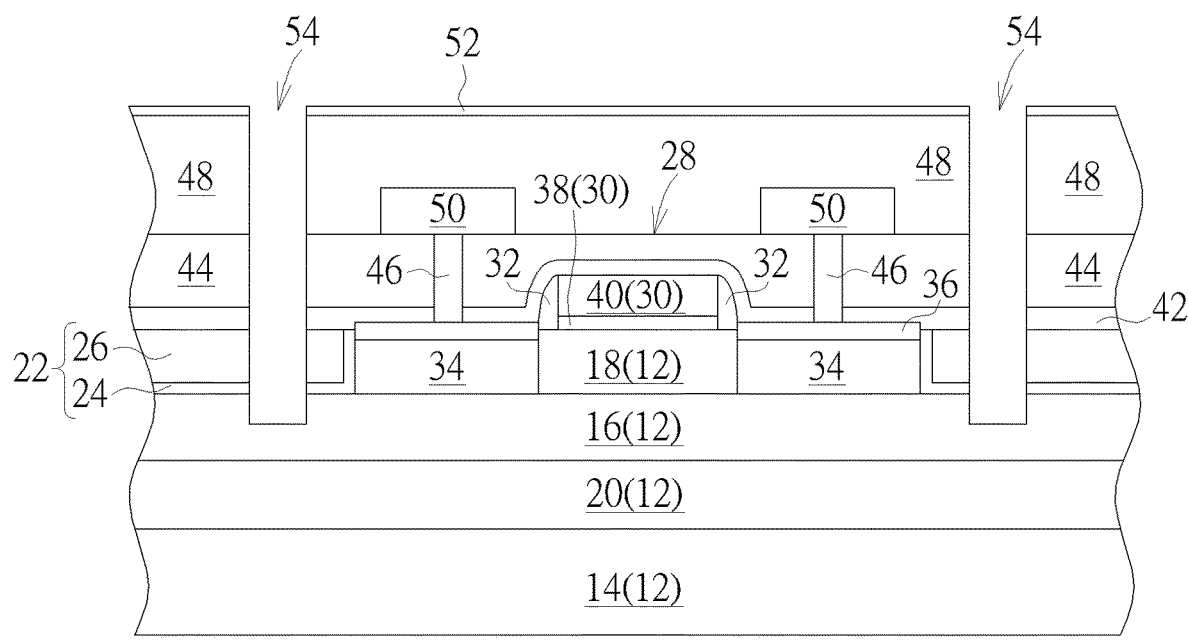

Next, as shown in FIG. 2, a mask layer 52 is formed on the IMD layer 48, and a patterned mask (not shown) is used as mask to remove part of the mask layer 52, part of the IMD layer 48, part of the ILD layer 44, part of the CESL 42 and part of the STI 22 to form first trenches 54 exposing the surface of the insulating layer 16 adjacent to two sides of the MOS transistor 28. It should be noted that the first trenches 54 formed through the etching process are preferably formed to expose the surface of the insulating layer 16 but does not penetrate through the insulating layer 16 and expose the trap rich layer 20 underneath, in which the bottom of the first trenches 54 could be even with or slightly lower than the top surface of the insulating layer 16.

Figure 3:
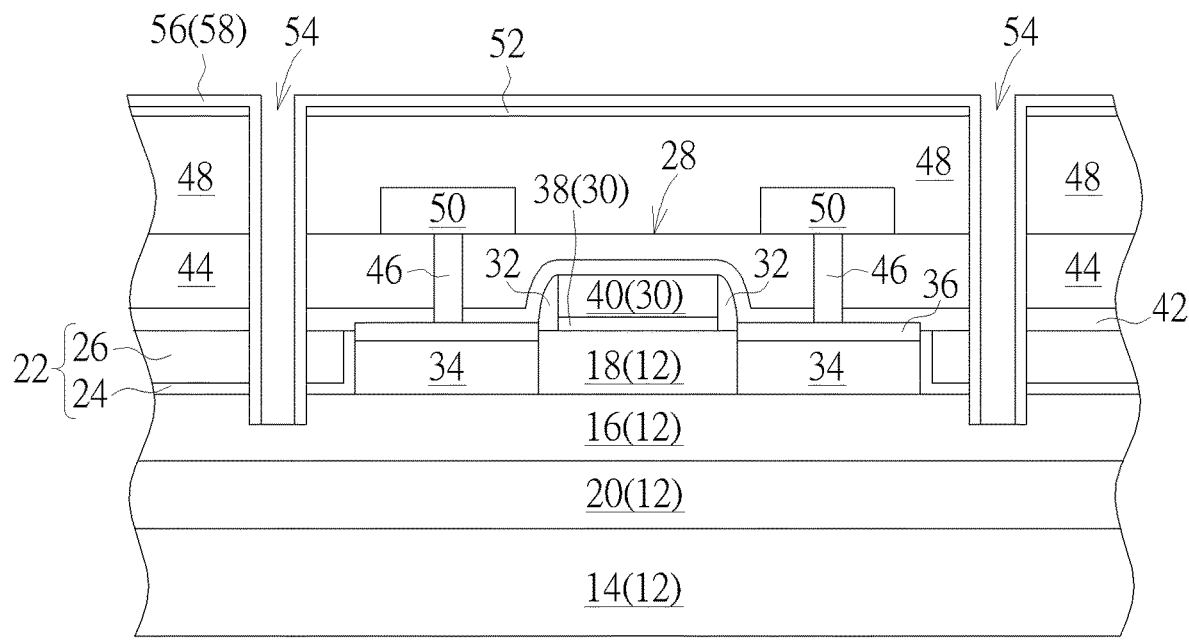

Next, as shown in FIG. 3, a liner 56 is formed on the mask layer 52 and into the first trenches 54, and an etching process is conducted to remove part of the liner 56 to form a spacer 58 on sidewalls of the first trenches 54. In this embodiment, the mask layer 52 and the liner 56 could be made of same material or different material while both layers 52 and 56 could be selected from the group consisting of SiN and SiCN. It should also be noted that since a mask layer 52 was already disposed on the IMD layer 48 before forming the liner 56, a mask layer 52 and a liner 56 are preferably disposed on the top surface of the IMD layer 48 after forming the liner 56 while only a liner 56 is disposed on sidewalls of the IMD layer 48.

Figure 4:
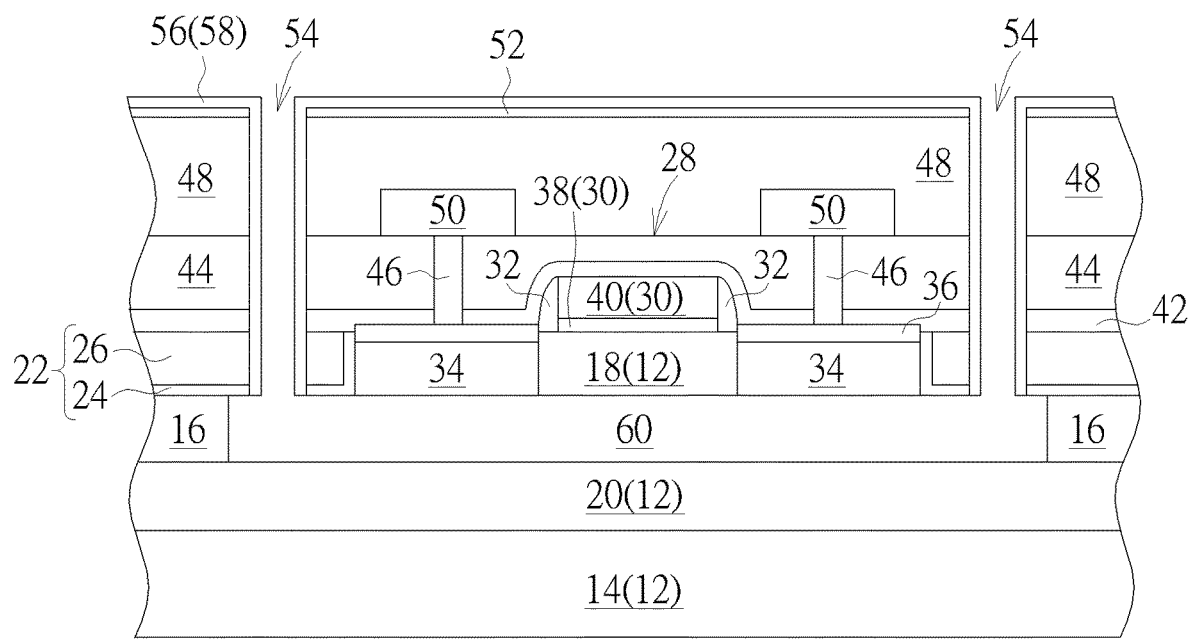

Next, as shown in FIG. 4, a wet etching process is conducted to remove part of the insulating layer 16 and even part of the liner 56 through the first trenches 54 to form an air gap 60 under the MOS transistor 28. In this embodiment, etchant from the wet etching process could include but not limited to for example dilute hydrofluoric acid (dHF) or HF. Moreover, it should be noted that since the STI 22 preferably includes a liner 34 made of SiN between the insulating layer 26 made of the silicon oxide and the insulating layer 16 underneath, it would be desirable to use the liner 34 as a protective barrier to prevent loss of the insulating layer 26 when the wet etching process were conducted to remove part of the insulating layer 16 for forming the air gap 60.

Figure 5:
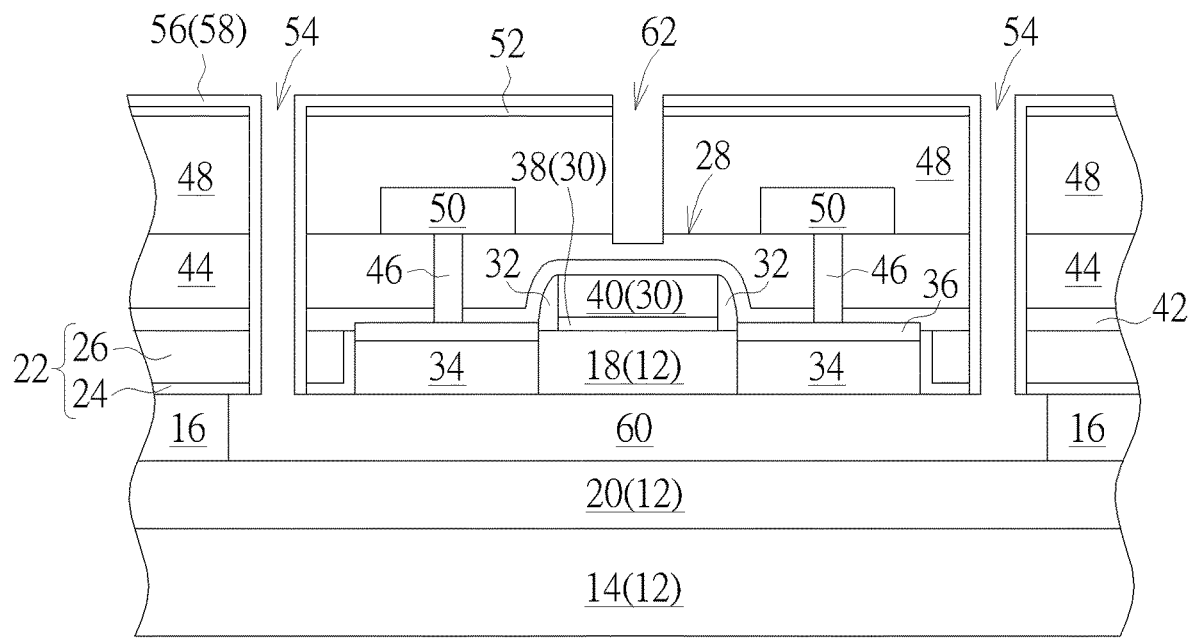

Next, as shown in FIG. 5, a patterned mask (not shown) is formed on the IMD layer 48 to expose part of the liner 56 directly above the gate structure 30, and an etching process is conducted by using the patterned mask as mask to remove part of the liner 56, part of the mask layer 52, and part of the IMD layer 48 directly on top of the gate structure 30 to form a second trench 62, and the patterned mask is stripped thereafter. It should be noted that the etching process conducted to form the second trench 62 preferably removes part of the IMD layer 48 and even part of the ILD layer 44 but does not remove any of the CESL 42 so that the bottom of the second trench 62 could be slightly lower than, even with, or slightly higher than the top surface of the ILD layer, which are all within the scope of the present invention.

Figure 6:
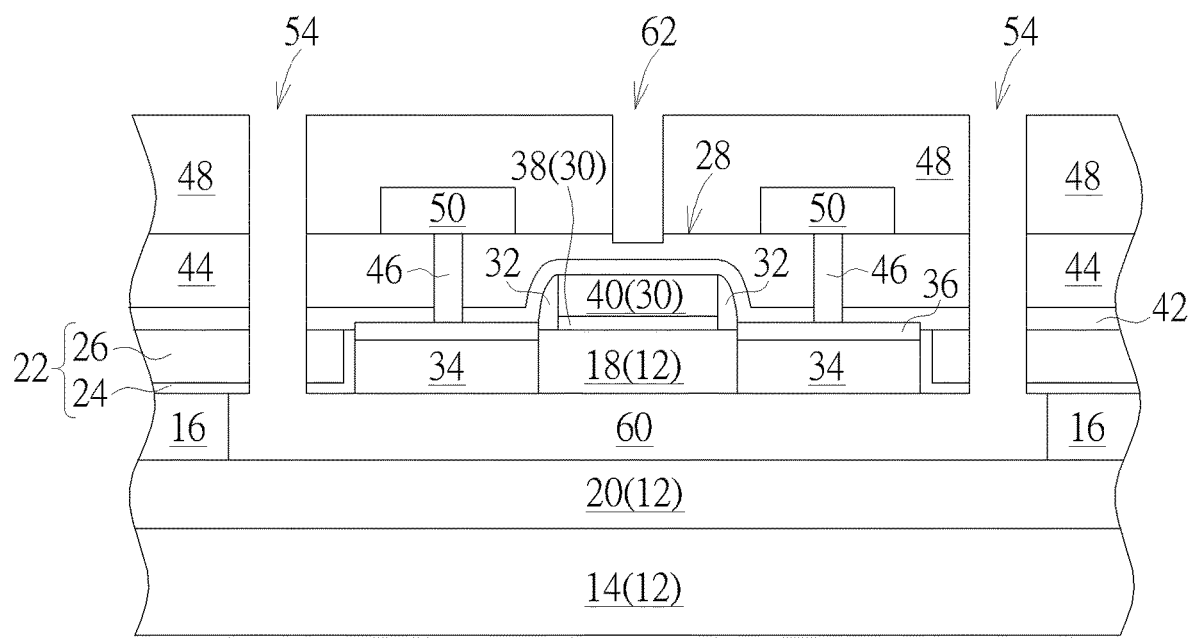

Next, as shown in FIG. 6, another wet etching process is conducted by using etchant such as phosphoric acid to completely remove the spacer 58 and the remaining mask layer 52 to expose the top surface of the IMD layer 48, sidewalls of the IMD layer 48, sidewalls of the ILD layer 44, and sidewalls of the STI 22.

Figure 7:
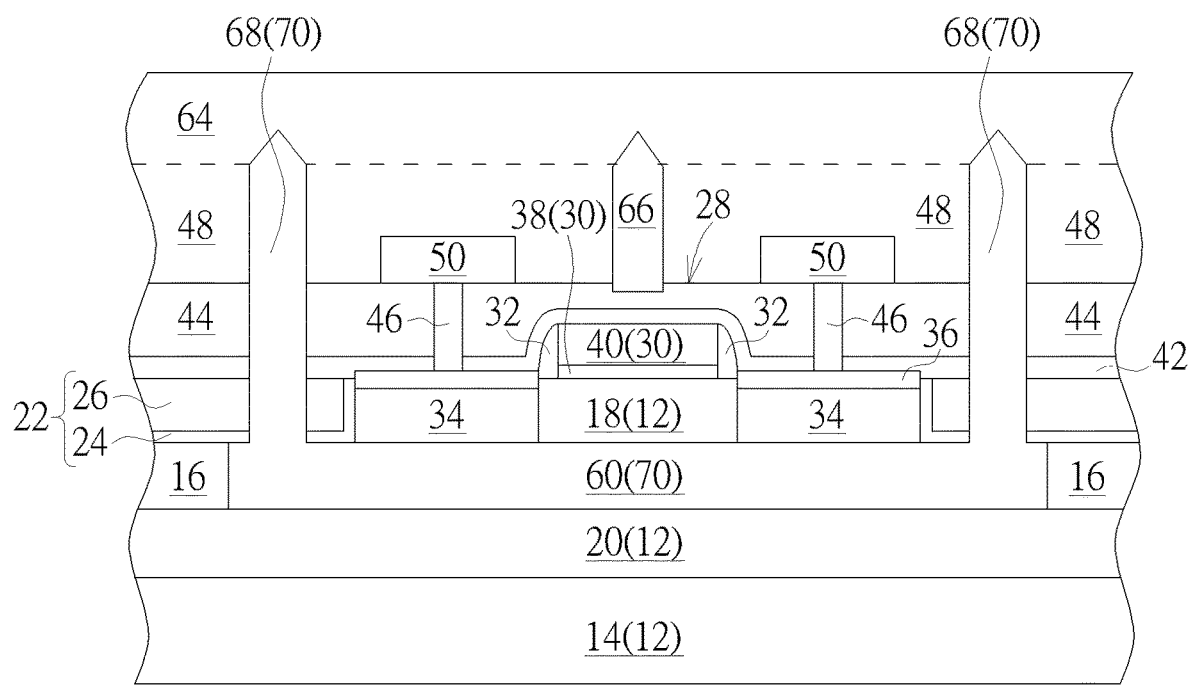

Next, as shown in FIG. 7, another IMD layer 64 is formed on the IMD layer 48 to seal the first trenches 54 and the second trench 62 for forming another air gap 66 directly on top of the MOS transistor 28 and at the same time forming air gaps 68 adjacent to two sides of the MOS transistor 28. Specifically, the original second trench 62 is preferably sealed by the IMD layer 64 to form the air gap 66 while the original first trenches 54 are sealed to form air gaps 68, in which the tip or topmost portion of each of the air gaps 66 and 68 preferably forms a reverse V-shape after the trenches 54, 62 are sealed by the IMD layer 64 and the air gap 60 under the MOS transistor 28 is connected to the air gaps 68 to forma new air gap 70 altogether. The newly formed air gap 70 preferably surrounds the entire MOS transistor 28 and has a U-shape cross-section.

Referring again to FIG. 7, FIG. 7 illustrates a structural view of a semiconductor device according to an embodiment of the present invention. As shown in FIG. 7, the semiconductor device preferably includes an active device such as a MOS transistor 28 disposed on the substrate 12, an ILD layer 44 disposed on the MOS transistor 28, an IMD layer 48 disposed on the ILD layer 44, an air gap 66 disposed in the ILD layer 44 and IMD layer 48 directly on top of the gate structure 30 of the MOS transistor 28, and air gap 70 disposed under the MOS transistor 28. Preferably, the air gap 70 is disposed in the insulating layer 16 under the gate structure 28 and source/drain region 34 and extending along two sides of the MOS transistor 28 upward into the ILD layer 44 and IMD layers 48, 64 to form a U-shape. In this embodiment, the tip of the air gaps 68 adjacent to two sides of the MOS transistor 28 and the tip of the air gap 66 directly on top of the gate structure 30 preferably include a reverse V-shape and the tip or topmost point of the reverse V-shape of the air gaps 68 is also substantially even with the tip or topmost point of the reverse V-shape of the air gap 66. Moreover, the tip or topmost point of the air gaps 68 adjacent to two sides of the MOS transistor 28 is preferably higher than the top surfaces of the gate structure 30 and the contact plugs 46 and metal interconnections 50 adjacent to two sides of the gate structure 30.

Overall, the present invention first forms an active device on a SOI substrate, forms an ILD layer and IMD layer on the active device, performs one or more etching processes to remove part of the IMD layer, part of the ILD layer, part of the insulating layer of the SOI substrate under the active device and part of the ILD layer and part of IMD layer directly above the active device, and then covers another IMD layer to form a U-shaped air gap under the active device and adjacent to two sides of the active device and at the same times forms another air gap directly on top of the active device. Preferably, the formation of the air gaps could be used to lower the capacitance of the device substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first silicon layer, an insulating layer on the first silicon layer, and a second silicon layer on the insulating layer;
   forming a metal-oxide semiconductor (MOS) transistor on the substrate;
   forming an interlayer dielectric layer (ILD) on the MOS transistor;
   removing part of the ILD layer to form a first trench to expose the insulating layer; and
   performing a wet etching process through the first trench to remove part of the insulating layer for forming a first air gap extending from one side of the MOS transistor to another side of the MOS transistor in the insulating layer and under the MOS transistor.

2. The method of claim 1, further comprising:
   forming a shallow trench isolation (STI) in the second silicon layer and around the MOS transistor;
   forming a contact plug adjacent to the MOS transistor in the ILD layer; and
   forming a first inter-metal dielectric (IMD) layer on the contact plug.

3. The method of claim 2, further comprising:
   forming a mask layer on the first IMD layer;
   removing part of the mask layer, part of the first IMD layer, part of the ILD layer, and part of the STI to expose the insulating layer;
   forming a liner on the mask layer and in the first trench; and
   removing part of the liner to form a spacer on sidewalls of the first trench.

4. The method of claim 3, further comprising:
   removing part of the mask layer and part of the first IMD layer directly on the MOS transistor to form a second trench;
   performing a second wet etching process to remove the spacer and the mask layer; and
   forming a second IMD layer on the first IMD layer to seal the first trench and the second trench for forming a second air gap directly on the MOS transistor and third air gaps adjacent to two sides of the MOS transistor.

5. The method of claim 4, wherein the first air gap is connected to the third gaps for forming a U-shape.

6. The method of claim 4, wherein a top surface of the second air gap is even with a top surface of the third air gaps.

7. The method of claim 4, wherein a tip of the third air gaps comprises a V-shape.

8. The method of claim 1, further comprising a trap rich layer between the insulating layer and the first silicon layer.

9. The method of claim 8, wherein the trap rich layer comprises a polysilicon layer or a dielectric layer.

10. A semiconductor device, comprising:
    a substrate having a first silicon layer, an insulating layer on the first silicon layer, and a second silicon layer on the insulating layer;
    a metal-oxide semiconductor (MOS) transistor on the substrate; and
    a first air gap in the insulating layer and directly under the MOS transistor, wherein a bottom surface of the first air gap is even with a bottom surface of the insulating layer.

11. The semiconductor device of claim 10, wherein the MOS transistor comprises:
    a gate structure on the substrate; and
    a source/drain region adjacent to two sides of the gate structure in the second silicon layer.

12. The semiconductor device of claim 11, wherein the first air gap is under the source/drain region and the gate structure.

13. The semiconductor device of claim 11, further comprising:
    an interlayer dielectric (ILD) layer on the MOS transistor;
    an inter-metal (IMD) layer on the ILD layer; and
    a second air gap in the IMD layer and directly on the gate structure.

14. The semiconductor device of claim 10, further comprising a trap rich layer between the insulating layer and the first silicon layer.

15. The semiconductor device of claim 14, wherein the trap rich layer comprises a polysilicon layer or a dielectric layer.

16. A semiconductor device, comprising:
    a substrate having a first silicon layer, an insulating layer on the first silicon layer, and a second silicon layer on the insulating layer;
    a metal-oxide semiconductor (MOS) transistor on the substrate;
    an interlayer dielectric (ILD) layer on the MOS transistor; and
    a first air gap under the MOS transistor and extended upward into the ILD layer, wherein the first air gap comprises a U-shape and extends from one side of the MOS transistor to another sides of the MOS transistor in the insulating layer.

17. The semiconductor device of claim 16, further comprising:
    an inter-metal (IMD) layer on the ILD layer; and
    a second air gap in the IMD layer and directly on the gate structure.

18. The semiconductor device of claim 17, wherein a top surface of the second air gap is even with a top surface of the first air gap.

19. The semiconductor device of claim 16, further comprising a trap rich layer between the insulating layer and the first silicon layer.

20. The semiconductor device of claim 19, wherein the trap rich layer comprises a polysilicon layer or a dielectric layer.

* * * * *